United States Patent [19]

DeVigne

[11] Patent Number: 5,111,459
[45] Date of Patent: May 5, 1992

[54] ELECTRONIC CIRCUIT TESTER
[75] Inventor: Yves DeVigne, Grenoble, France
[73] Assignee: DRAXY (s.a.r.l.), Saint Egreve, France
[21] Appl. No.: 98,033
[22] Filed: Sep. 17, 1987
[30] Foreign Application Priority Data
  Sep. 19, 1986 [FR] France .................. 86 13304
[51] Int. Cl.$^5$ .......................................... G01R 31/26
[52] U.S. Cl. .......................................... 371/27
[58] Field of Search ............ 371/15, 25, 27, 20; 324/73 R

[56] References Cited
U.S. PATENT DOCUMENTS

| 4,092,589 | 5/1978 | Chau et al. | 371/20 X |
| 4,517,512 | 5/1985 | Petrich et al. | 371/20 X |
| 4,517,661 | 5/1985 | Graf et al. | 371/27 X |
| 4,724,378 | 2/1988 | Murray et al. | 371/20 X |

OTHER PUBLICATIONS

Slater, M., "Microprocessor-Based Design", Mayfield Pub. Co., copyright 1987, pp. 241-3, 265-7, 273-7.
Cohen, B., et al., "The Design and Implementation of the MC68851 Paged Memory Management Unit", *IEEE Mirco*, Apr. 1986, pp. 13-28.

*Primary Examiner*—Stephen M. Baker
*Attorney, Agent, or Firm*—Lowe, Price, LeBlanc & Becker

[57] ABSTRACT

An electronic circuit tester according to the invention comprises: a connection board for connection with each of the terminals of the circuit to be tested; n boards (16), called electronic pins, comprising signal shaping means each of which is connected to an input of the connection board; a single test vector memory unit (17) containing all the test vectors for the circuit and from the circuit, those vectors transiting through said electronic pins; a central processing unit (10) for managing the system and the external links; in which the management of the vector memory is made alternatively by a memory management unit (22) connected independently from the other tester units to the central processing unit (10) or by an address processor (23) asynchronously operating with respect to the central processing unit.

4 Claims, 4 Drawing Sheets

ELECTRONIC CIRCUIT TESTER

FIELD OF THE INVENTION

The instant invention relates to an electronic circuit tester.

In the field of the manufacturing and use of integrated circuits, one of the main factors lies in quality. An integrated circuit being generally provided for being used as the heart of very complex assemblies, it is necessary to initially check that the circuit operates satisfactorily in any possible configuration and in any possible logical case. Indeed, during utilization a misoperation could appear very lately in a specific configuration. Such a misoperation could be catastrophic if, for example, the integrated circuit is used in a military, medical or industrial system.

BACKGROUND OF THE INVENTION

Accordingly, apparatuses called testers are used for checking the operation of electronic circuits, and integrated circuits often comprise structures which are not used during the normal operation but the only aim of which is to facilitate the checking of the good operation of the circuit.

Generally, testers are apparatus used on the one hand by the manufacturers of integrated circuits or complex electronic circuits, on the other hand, by users who test again each of the circuits they have acquired while, often, the manufacturer makes thorough checking only on a sampling of the circuits he manufactures and validates a batch as soon as a given percentage of the circuits in the batch appears to be fully good.

In any case, it is desirable that a tester presents the following features:

high speed and precision; indeed, a great number of tests are to be carried out on complex components and it is desirable that the elementary time duration used by each of the tests is as short as possible;

easiness of programmation and simplicity of use;

modular design for permitting that a same tester be able to test different circuits while minimizing the changes to the tester.

In the present application, only the testers permitting check of the operation of the whole set of pins of an electronic circuit will be considered and not the single-pin or single-way testers which exhibit modularity advantages but cost drawbacks, because, if it is desired to test a plurality of pins one has to duplicate a great number of circuits existing on each such tester, such as the test vector processor, the delay generation circuits, the various analog references, etc. Due to those duplications, those single-pin testers also exhibit the drawback that the test conditions are not reproducible from one way as testing to another. Additionally, in those structures, the test vectors are arranged bit by bit in the memories of the different ways and are accordingly difficult to be accessed by the operator.

As regards the operations to be carried out, a tester usually implements successively three types of controls.

First, a likeliness control, that is a rough control wherein it is simply checked whether the various supplies and the various input/output ports are not shortened or open.

Second, a parametric control wherein it is checked at each input/output whether the impedance is within an acceptable range for the various signals. In those two first controls, analog values are measured and set time values are to be taken into account. Each individual test has typically a time duration of some milliseconds. On an integrated circuit comprising 256 pins, about 500 tests will be carried out for the parametric control.

Thirdly, a functional control wherein the suitable operation of the circuit is checked. In this purpose, a series of signals, called test vectors, shaped as regards their duration and their amplitude are sent on one or a plurality of circuit pins, and it is checked at one or a plurality of other pins if the response received signals correspond effectively to the desired function of the circuit. During the functional control, the speed of the logic circuit is also checked. Typically, an elementary functional test has a duration of about 100 ns and 4,000 tests are implemented for an integrated circuit comprising 256 pins.

An example of a known test machine is schematically shown in FIG. 1. This machine comprises a central processing unit 10 connected on the one hand to external elements such as a terminal 11, a printer 12, and a port 13 for establishing a link with other apparatus, for example a communication link towards an host computer. On the other hand, the central processing unit 10 is connected to a bus 14 for transmitting and receiving data towards and from various elements of the tester.

The circuit to be tested is connected to the tester through a plug board, not shown, and a load board 15, the input/output connections of which correspond to the number of pins of the element to be tested. Each of those connections is connected to a specific card, called electronic pin, 16, only one of which is shown in FIG. 1 and which constitute, in fact, a set of boards, geometrically arranged generally as a ring. Those cards 16 comprise, on the one hand, a bidirectional link towards a test vector memory 17 and a specific link towards a terminal of the load board 15 and, on the other hand, access to common circuits for providing reference voltages, 19, and time delays, 19', to the general bus 14. Each electronic pin 16 comprises amplitude and time shaping circuits for adjusting the signals received from memory 17 to the references provided by circuits 19 and 19'. The load board 15 comprises buffer impedances and switches for connecting the pins to be tested either to an electronic pin or to a central measuring unit 18 which applies currents and measures voltages or conversely.

Each of the elements 15, 16, 17, 18, 19, 19' has to be programmed for insuring a satisfactory operation and is connected to the common bus 14; each of those elements, or each of the sub-sets constituting each of those elements, has a specific address permitting recognition as the signals from the bus addressed thereto and, conversely, can send back onto the bus characteristic signals that are detected by the CPU 10.

This description of a prior art tester is very schematic; its main aim is to show the whole architecture of a conventional tester based on a central CPU and a common interconnection bus together with units that are parallel connected with different addresses and each of which carries out one of the elementary functions of the tester.

In such a structure, the operation of the units 15, 16, 18, 19, 19' and the operations to be carried out onto those units are unavoidably relatively slow, for example in the range of some milliseconds or some tenths of millisecond. On the contrary, the memory 17 that contains the test vectors to be sent towards the circuit to be tested and the vectors received therefrom, has to be read and written at a very fast rate, usually in the range of some tenths of nanoseconds. In fact, the read/write speed of the memory has to correspond to the maximal speeds for which the circuit to be tested has been designed, for checking its high frequency operation. Accordingly, the CPU 10 has to manage in a very fast way the test vector memory 17 through the bus 14. This memory 17 is a large scale memory, containing for example some megabytes. Accordingly, in the prior art testers, various sophisticated means have been used for maximizing this management speed but this causes very complex technical solutions because the bus 14 is heavily loaded due to the fact of its great number of connections with a plurality of units and accordingly its transmission speed is a priori limited.

Additionally, the fact of providing a central circuit 19' transmitting to various boards (electronic pins) time signals for fixing phase references causes those phase references to unavoidably include systematic errors, different for the different pins, due to the time delays caused by the wire lengths that cannot be neglected in such complex circuits.

Thus, an object of the invention is to provide a tester, the general architecture of which permits an increase of the management speed of the test vector memory.

Another object of the invention is to provide a tester wherein the link between the tested circuit and the logical portions of the tester is improved for permitting a highest modularity.

A further object of the instant invention is to provide a tester permitting to obtain very precise time phase references.

SUMMARY OF THE INVENTION

Those objects and advantages of the instant invention are attained by providing an electronic circuit tester comprising: a connection board for connection with each of the terminals of the circuit to be tested; n boards, called electronic pins, comprising signal shaping means each of which is connected to an input of the connection board; a single test vector memory unit containing all the test vectors for the circuit and from the circuit, those vectors transiting through said electronic pins; a central processing unit for managing the system and the external links; wherein the management of the vector memory is made simultaneously by a memory management unit connected independently from the other tester units with the central processing unit and with an address processor asynchronously operating with respect to the central processing unit.

According to an embodiment of the invention, this tester further comprises a central analog measuring unit, wherein each electronic pin comprises on the same board: a programmable latch circuit for timing and suitably delaying the test vectors transmitted by said electronic pin; a circuit providing said delay; programmable amplitude-shaping circuits; and a multiple-xing circuit for connecting the circuit to be tested either to the above mentioned circuits or to the analog central measuring unit.

The connection of the test vector memory to its own address processor and its own memory management circuit permits a very fast operation independently of the general bus of the central processing unit.

The provision of time delay references incorporated into the electronic pins permits obtaining of very precise time references, specific to each electronic pin.

The choice of those elements mounted on each electronic pin permits to obtain a very high modularity.

BRIEF DESCRIPTION OF THE DRAWINGS

Those objects, features and advantages and others of the instant invention shall be explained in greater details in the following description of a preferred embodiment made in connection with the attached drawings wherein.

DETAILED DESCRIPTION OF PREFERRED EMBODIMENTS

Figure 1:
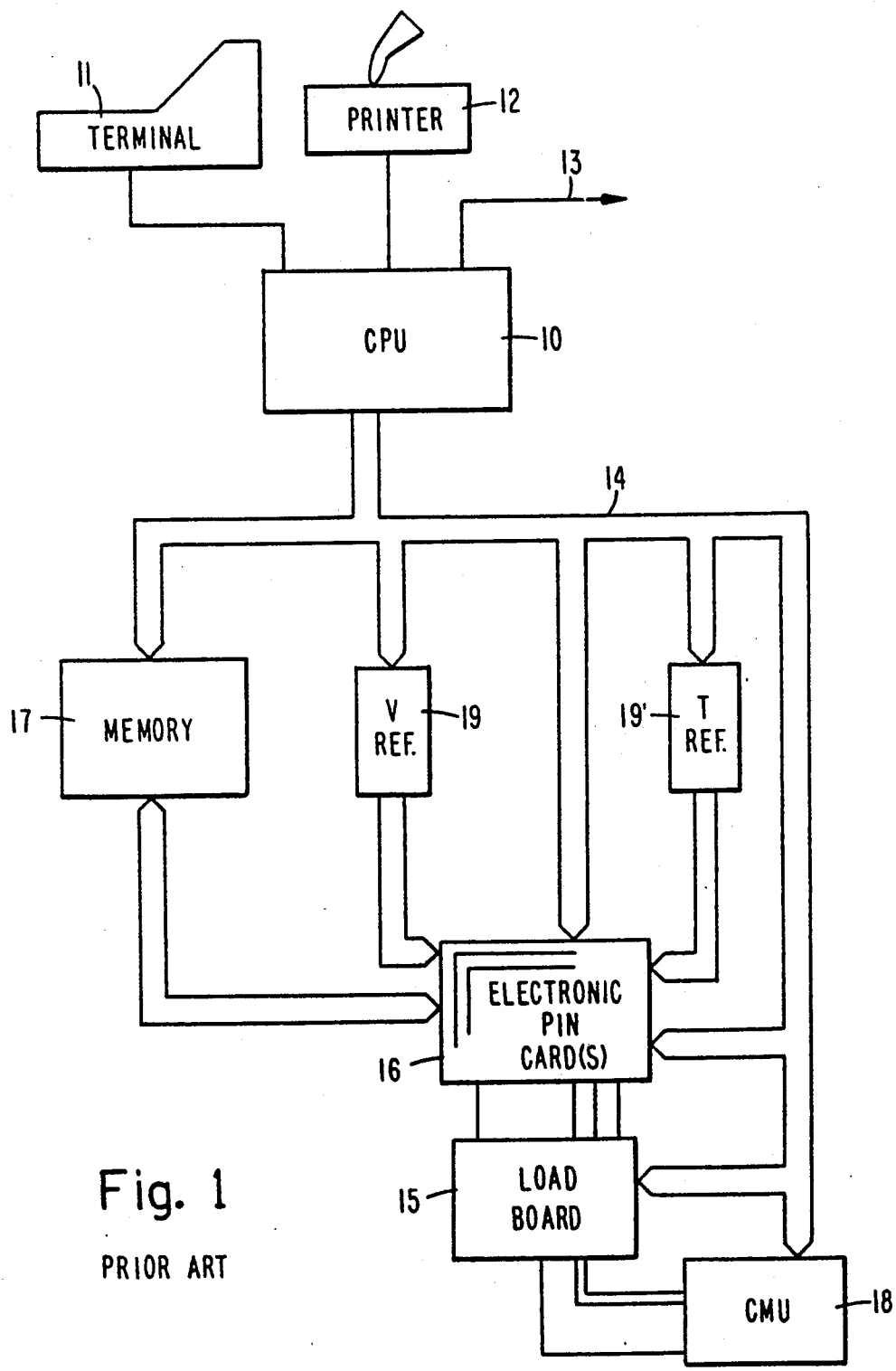
FIG. 1 shows a prior art tester architecture.
Figure 2:
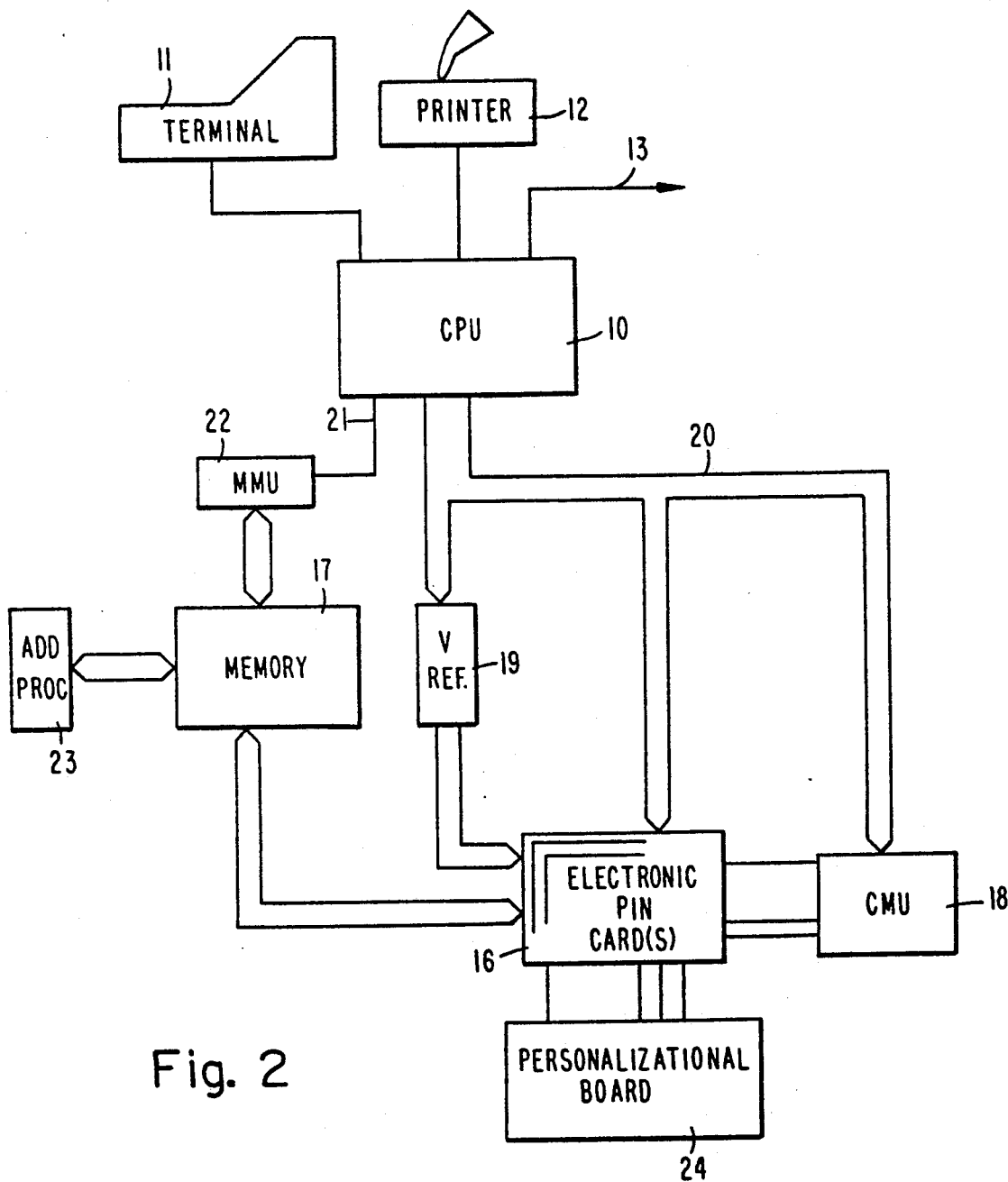
FIG. 2 shows a tester architecture according to the instant invention.

FIG. 2 shows the general architecture of a tester according to the invention in a way as similar as possible to FIG. 1 in order to emphasize the differences between the architecture according to the invention and the conventional prior art architectures.

One can see in FIG. 2 the CPU 10, the terminal 11, the printer 12 and the communication bus 13. However, the connection between the CPU 10 and the various tester units is different. In FIG. 2, the units have been shown in a way similar to the case of FIG. 1 for facilitating the comparison but it will be seen that the implementation of those units can be distinct. So, one can see in FIG. 2 the test vector memory 17, the electronic pins 16 and the central measuring unit 18. A common bus 20 is always used but for carrying out the only "slow" operations, called configuration operations, and not the direct management of the test vector memory.

The CPU 10 no longer communicates directly with memory 17 but through a link 21 such as a serial link RS 232C, with a specific memory management unit (MMU) 22. A specialized address processor 23 permits to carry out specific programmable addressing sequences in the memory. All those circuits are available on the market. For example, for the MMU 22 one can use a Motorola M6809 circuit and for the address processor a circuit from AMD Corporation called AM 2910 which permits to attain very high addressing rates, higher than 10 MHz. This processor is associated with a variable frequency clock for permitting, in some cases, to modify the test sequence rate.

The memory plane where the test vectors are stored is accordingly sharable between the MMU 22 which conventionally permits to read and write in the memory for checking or loading and the processor 23 which permits a memory addressing for emitting test vectors at a quick rate chosen in accordance with the test specifications.

In addition to this general architecture change, the invention provides for specific configuration and assembly of the various functions on the boards constituting the system.

Figure 3:
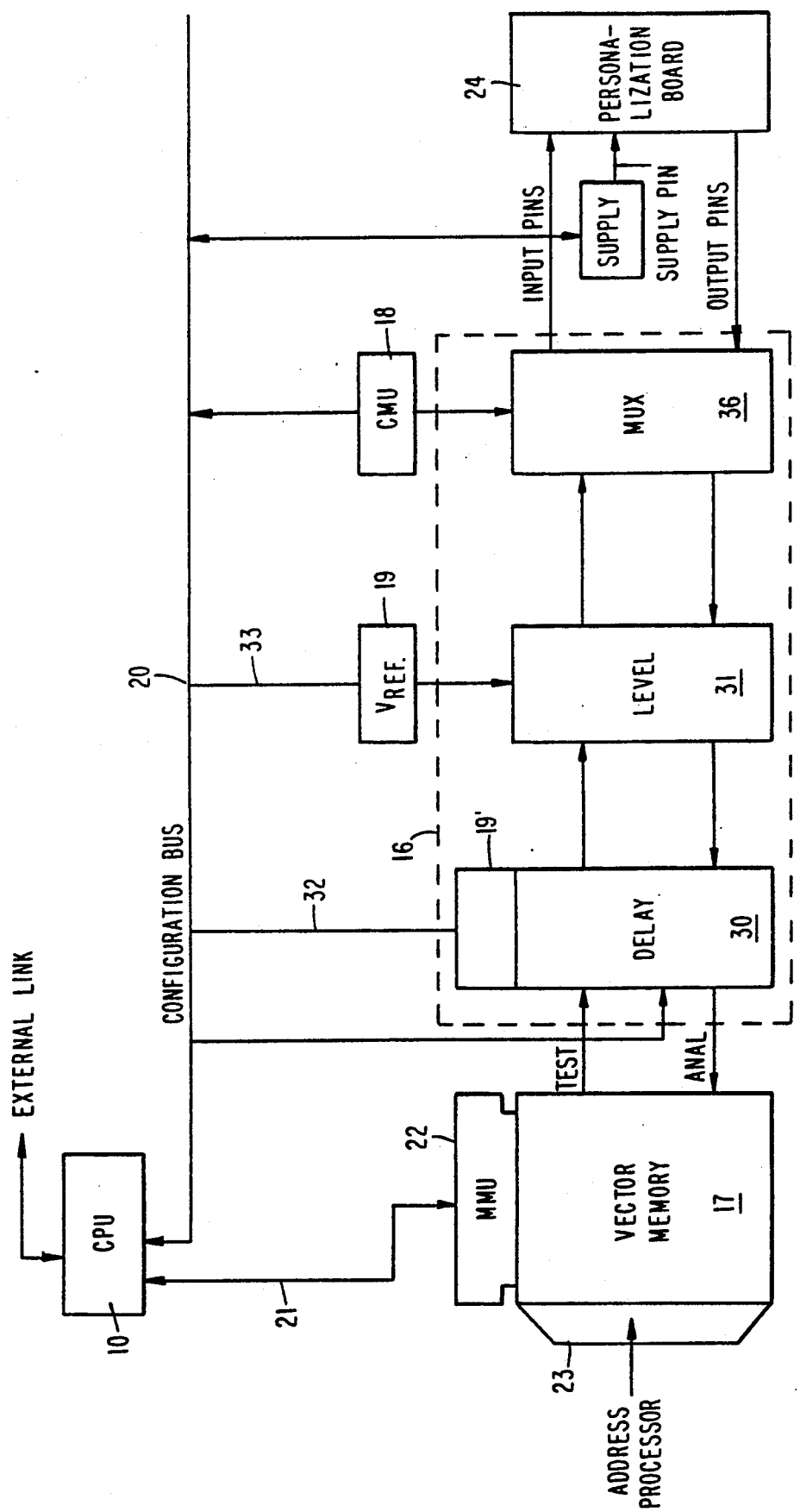
FIG. 3 shows another aspect of the tester architecture according to the invention.

This specific configuration which shall be described in detail in connection with FIG. 3 is shown in FIG. 2. The block 19' of FIG. 1 providing the time delay values for each pin is no longer present. In fact, this circuit is incorporated in the electronic pin 16. Also, the electronic pin is no longer associated with a load board 15 but with a personalization board 24. This personalization board 24 no longer comprises programmable active switches which are now contained in the electronic pin, but only wiring elements for electromechanically connecting the pins of the tested circuit to the electronic pin 16. As a consequence, the central measuring unit 18 is directly connected with the electronic pins.

FIG. 3 is a functional representation showing the association of the system units. One can find, with different symbols than in FIG. 2 but with the same reference numerals, the CPU 10, the bus 20 called configuration bus, the link 21 with the MMU 22, the address processor 23 and the vector memory 17. The vector memory is arranged into channels, each of which is connected to a specific electronic pin 16. Each electronic pin 16 comprises in particular: means 30 for the timing and delay setting, means 31 for setting the amplitude of the test vectors emitted or received, and a multiplexor 36. The link between the test vector memory 17 and the board 16 operates in a first direction for emitting test vector signals (TEST) and in the other direction for receiving back the analysis test vector (ANAL) which are picked out from the circuit to be controlled and transmitted to the vector memory for being compared to a waited response or being stored.

Figure 4:
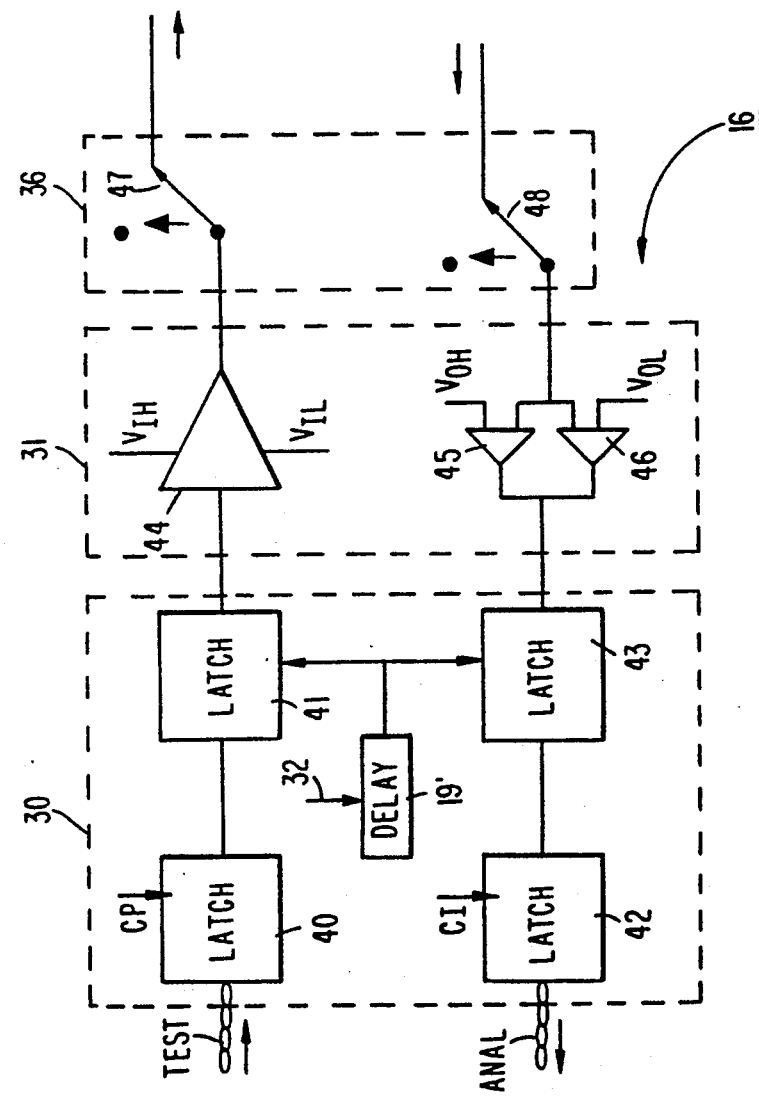
FIG. 4 is a block diagram of an electronic pin according to the invention and shows the possible two-way transfer in a given electronic pin.

The time setting circuits 30 mainly comprise a pair of latches 40, 41 on the TEST way, and 42, 43 on the ANAL way (FIG. 4). The first latches 40, 42 provide for the timing with clock C1 of the address processor 23. The second latches 41, 43 receive an input from a delay circuit 19' programmable by a control 32 from the configuration bus 20. The second latches 41, 43 permit to impress a given delay onto the signals transmitted by the vector memory and the ones re-emitted by the electronic pin with respect to the rate clock C1 of the address processor 23.

It will be noted that the provision of a programmable delay circuit for each electronic pin does not cause the system to be more complex than the prior art arrangement wherein the delay references were provided from a single circuit 19' because:
those delay circuits are in practice relatively simple, the use of a central circuit made it compulsory to use a high speed multiplexing system on each electronic pin and this circuit was in fact more difficult to implement than the delay circuits.

With the disposition according to the invention, parasitic delays associated with the transmission lines and with the difference between the intermediary components (multiploxors, etc.) are avoided and the programming is more simple.

The level setting circuit 31 comprises impedance arrays, conventionally carried out with transistors, and receives supply from the level reference unit 19 programmable by a control 33 from the configuration bus 20.

This circuit 31 permits transforming the logic signals from the test memory into voltage pulses varying between high and low levels determined by the level reference circuit 19. Conversely, this circuit 31 comprises a return way transforming into logic signals the voltage from the tested pin by comparison with reference values programmed by circuit 19.

The multiplexor 36 permits switching the tested circuit pin either to the electronic pin circuits or to the central measuring unit 18.

In case the system is in a functional control phase, each electronic pin 16 is directly connected with the personalization board 24. The personalization board according to the invention comprises wirings for connection to a circuit to be tested.

Finally, for the initial controls, that is, the likeliness controls and the parametric controls, the multiplexor 36 sends back the output of the personalization board to the central measuring unit 18. Those measuring operations of currents and voltages being made in an analog way, digital/analog converters and analog/digital converters are provided in the central measuring unit 18 for communication with the bus 20.

FIG. 4 shows in a more detailed form the main elements of the electronic pin 16 while separating the transmission directions. The synchronization and delay setting block 30 has been described hereinabove. The block 31 comprises in the direction TEST an operational amplifier 44 determining the high and low input levels $V_{IH}$ and $V_{IL}$ according to the values transmitted by the block 19 which also provides high and low comparison levels $V_{OH}$ and $V_{OL}$ to comparators 45 and 46 analyzing the signals sent back by the circuit to be tested. The multiplexor 36 can be symbolized by two-way switches 47 and 48 connecting the personalization board to the other circuits of the electronic pin or to the central measuring unit 18.

An additional advantage of the invention is that it permits manufacture of a tester having a low utilization cost for the user. This is, in particular, due to the fact that the multiplexor 36 is distributed on the electronic pins while it was conventionally provided onto a load board 15. The load board was accordingly a costly board, the multiplexors comprising a great number of relays, and the user had to use a specific load board for each family of tested circuits. According to the invention, the user has only to change the personalization boards that comprise no costly elements but only connectors. In addition, due to their simplicity and their specialization, the personalization boards associated to the tester architecture according to the invention can manage a large number of circuits inasmuch as they are mechanically compatible as regards the pin arrangement.

I claim:
1. Electronic circuit tester comprising:
   a connection board (24) for connection with each of the terminals of a circuit to be tested;
   n boards (16), called electronic pins, comprising signal shaping means each of which is connected to an input of the connection board;
   a single test vector memory means for (17) containing all the test vectors for the circuit and from the circuit, including means for controlling application of said test vectors to the circuit to be tested through said electronic pins;
   a central process unit (10) for managing the tester and external links;
   wherein the management of the vector memory is made by at least one of a memory management unit (22) connected independently from other tester units to the central processing unit (10) and an address processor (23) operating asynchronously with respect to the central processing unit.
2. A tester according to claim 1, wherein
   each electronic pin comprises, on the same board, wave-form generating means (30) and amplitude shaping means,
   said wave-form generating means being programmable by digital signals from the CPU, said amplitude shaping means being programmable by analog signals, the tester further comprising an analog level generating circuit (19) external to the electronic pins, converting digital signals from the CPU to analog signals provided to all the electronic pins.

3. A tester according to claim 2, wherein said waveform generating means comprise:

a programmable latch circuit (30, 41-43) for timing providing a suitable delay to the test vectors transmitted by said electronic pin, and a circuit (19') providing said delay.

4. A tester according to claim 1, further comprising an analog central measuring unit (18), wherein each electronic pin (16) further comprises on the same board a multiplexing circuit (36) for connecting the circuit to be tested at least one of to said vector memory through the circuits of the electronic pin and to the analog central measuring unit (18).

* * * * *